United States Patent
Wu et al.

(10) Patent No.: US 7,573,712 B2
(45) Date of Patent: Aug. 11, 2009

(54) ELECTRONIC DEVICE WITH AIRFLOW GUIDING DUCT

(75) Inventors: Chia-Kang Wu, Taipei Hsien (TW); Li-Ping Chen, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 24 days.

(21) Appl. No.: 11/833,242

(22) Filed: Aug. 3, 2007

(65) Prior Publication Data

US 2008/0232066 A1 Sep. 25, 2008

(30) Foreign Application Priority Data

Mar. 20, 2007 (CN) .................... 2007 2 0200161 U

(51) Int. Cl.
    *H05K 7/20* (2006.01)
(52) U.S. Cl. ................... 361/695; 361/690; 361/694; 361/697; 174/16.1; 174/16.3; 165/80.3; 165/104.33; 165/122
(58) Field of Classification Search .................. None
    See application file for complete search history.

(56) References Cited

U.S. PATENT DOCUMENTS

| | | | |
|---|---|---|---|
| 6,169,656 B1 | 1/2001 | Shen | |
| 6,343,011 B1 * | 1/2002 | Yu | 361/695 |
| 6,400,568 B1 * | 6/2002 | Kim et al. | 361/697 |
| 6,678,157 B1 * | 1/2004 | Bestwick | 361/695 |
| 6,785,145 B1 * | 8/2004 | Wong | 361/752 |
| 6,951,446 B2 * | 10/2005 | Hung | 415/213.1 |
| 7,061,761 B2 * | 6/2006 | Tucker et al. | 361/695 |
| 7,256,993 B2 * | 8/2007 | Cravens et al. | 361/690 |
| 7,310,228 B2 * | 12/2007 | Chen | 361/695 |
| 2004/0004812 A1 * | 1/2004 | Curlee et al. | 361/687 |
| 2004/0095723 A1 * | 5/2004 | Tsai et al. | 361/695 |
| 2006/0181846 A1 * | 8/2006 | Farnsworth et al. | 361/695 |
| 2008/0101018 A1 * | 5/2008 | Long et al. | 361/695 |
| 2008/0144281 A1 * | 6/2008 | Chen et al. | 361/695 |

* cited by examiner

*Primary Examiner*—Boris L Chervinsky
(74) *Attorney, Agent, or Firm*—Frank R. Niranjan

(57) ABSTRACT

An electronic device with an airflow guiding duct includes a chassis, an airflow guiding duct, and a top cover. The chassis includes a bottom wall and a sidewall perpendicular to the bottom wall. A circuit board is mounted on the bottom wall. A pair of securing members protrudes from a top of the sidewall. The airflow guiding duct includes a top wall and a plurality of securing slots defined in the top wall corresponding to the securing members, for the securing members being lockingly engaging in the securing slots, thereby limiting movement of the airflow guiding duct in directions parallel to the circuit board. The cover is mounted on the chassis and abuts against the top wall of the airflow guiding duct, for limiting movement of the airflow guiding duct in a direction perpendicular to the circuit board.

9 Claims, 3 Drawing Sheets

ELECTRONIC DEVICE WITH AIRFLOW GUIDING DUCT

BACKGROUND

1. Field of the Invention

The present invention relates to electronic devices, particularly to an electronic device with an airflow guiding duct for heat dissipating modules therein.

2. Description of Related Art

A heat dissipating module is generally mounted on a motherboard of an electronic device, such as a computer or a server, for dissipating heat generated by electronic components in the electronic device. With the development of the computer industry, heat generated by the electronic components becomes greater due to faster speeds of the computers or servers. The conventional heat dissipating module cannot satisfy the requirements of current computer or server systems by itself so an airflow guiding duct is usually mounted above the heat dissipating module on the motherboard, for guiding airflow, increasing effectiveness heat dissipation. Conventionally, the airflow guiding duct is mounted in the electronic device via screws or bolts. This method involves many fasteners and adds to cost of labor in manufacturing.

What is needed, therefore, is an electronic device with airflow guiding duct having a simpler structure and easy to be assembled.

SUMMARY

An electronic device with an airflow guiding duct includes a chassis, an airflow guiding duct, and a top cover. The chassis includes a bottom wall and a sidewall perpendicular to the bottom wall. A circuit board is mounted on the bottom wall. A pair of securing members protrudes from a top of the sidewall. The airflow guiding duct includes a top wall and a plurality of securing slots defined in the top wall corresponding to the securing members, for the securing members being lockingly engaging in the securing slots, thereby limiting movement of the airflow guiding duct in directions parallel to the circuit board. The cover is mounted on the chassis and abuts against the top wall of the airflow guiding duct, for limiting movement of the airflow guiding duct in a direction perpendicular to the circuit board.

Other advantages and novel features of the present invention will become more apparent from the following detailed description of preferred embodiment when taken in conjunction with the accompanying drawings, in which:

DETAILED DESCRIPTION OF THE EMBODIMENT

Figure 1:
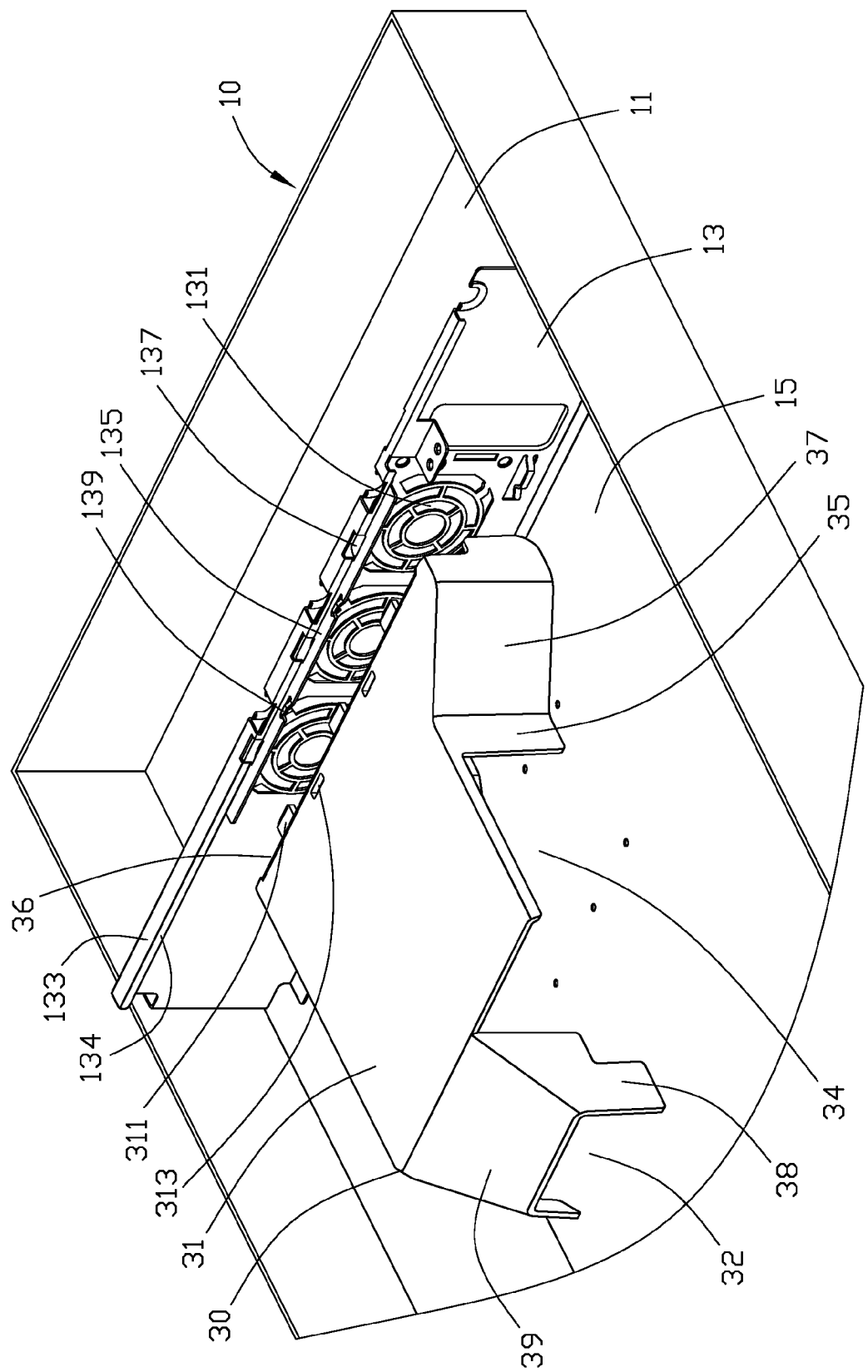
FIG. 1 is an isometric perspective partial view of a computer or server enclosure with an airflow guiding duct in accordance with a preferred embodiment, with a top cover thereof removed and the airflow guiding duct not connected.

Referring to FIG. 1, a computer or server enclosure with an airflow guiding duct in accordance with the present invention includes a chassis 10, an airflow guiding duct 30, and a top cover 50 (shown in FIG. 3) mounted on the chassis 10.

The chassis 10 includes a bottom wall 11 and a sidewall 13 perpendicular to the bottom wall 11. A motherboard 15 is mounted on the bottom wall 11 abutting the sidewall 13. A plurality of heat dissipating holes 131 is defined in the sidewall 13 for air flowing therethrough. A main flange 133 parallel to the motherboard 15 is perpendicularly bent from a top edge of the sidewall 13. A secondary flange 134 perpendicularly extends down from a side edge of the main flange 133. A supporting flange 135 parallel to the main flange 133 extends from a bottom edge of the secondary flange 134. A plurality of receiving slots 137 is spacedly defined in the secondary flange 134 at a joint of the main flange 133 and the supporting flange 135. A pair of securing members 139 protrudes up from an outer edge of the supporting flange 135.

Figure 2:
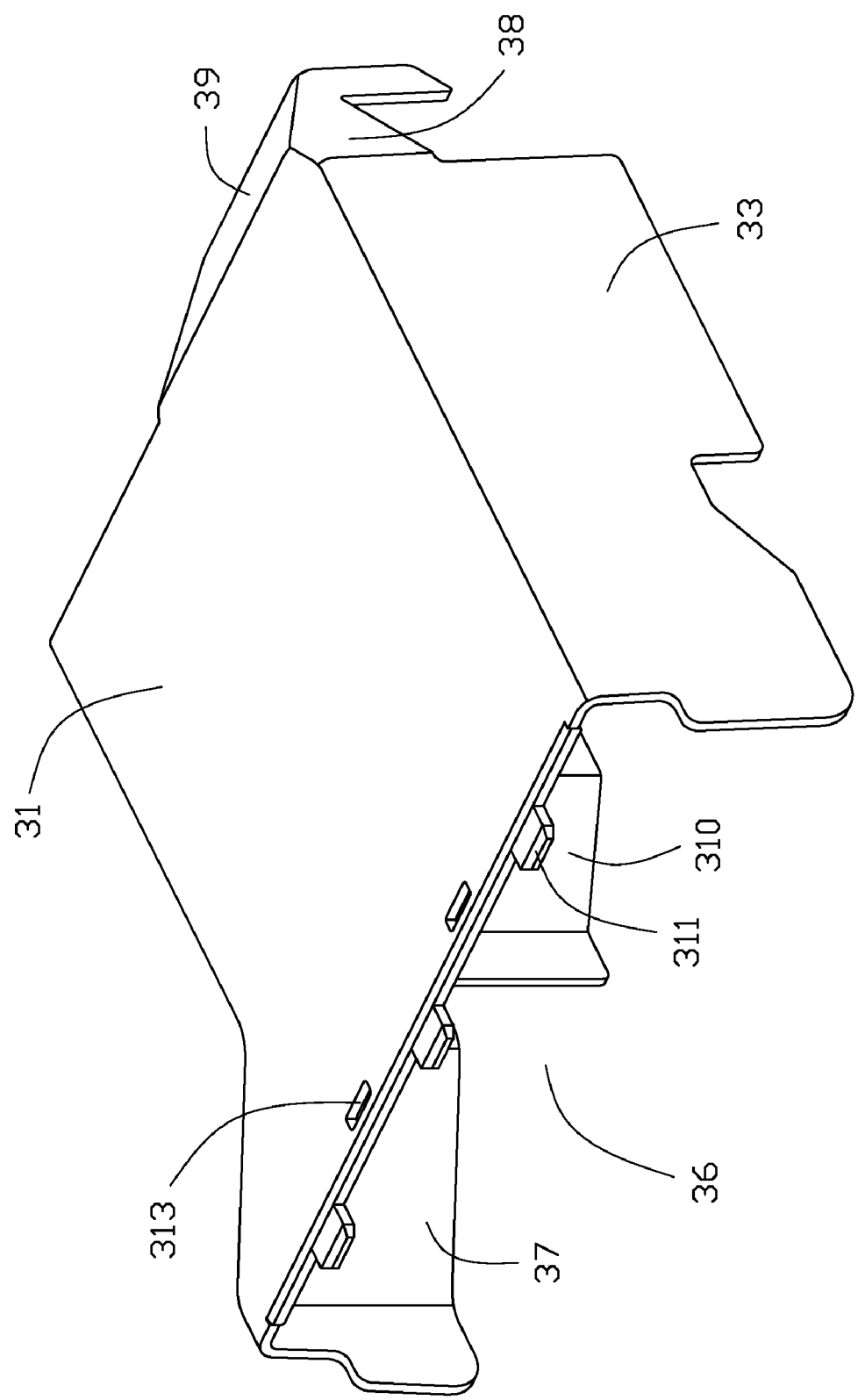
FIG. 2 is an isometric enlarged view of the airflow guiding duct in FIG. 1, but viewed in another aspect.

Referring also to FIG. 2, the airflow guiding duct 30 includes a substantially rectangular base, an expanded portion protruding from a front end of the base toward the sidewall 13, and a smaller portion protruding from a rear end of the base. The base and the expanded portion include a common trapezoid top wall 31 and a common sidewall 33 perpendicular to the top wall 31. The base includes a sidewall 35 opposite to the sidewall 33. The expanded portion includes a sidewall 37 obliquely connected to the sidewall 35 of the base. The smaller portion of the airflow guiding duct 30 includes a pair of oblique sidewalls 38 and an oblique top wall 39. One of the oblique sidewalls 38 of the smaller portion is connected to the sidewall 33 of base. The sidewalls 38 and the top wall 39 of the smaller portion together define a first opening 32. A second opening 34 is defined at a rear corner of the base by the sidewall 35 and top wall 31 of the base, and one oblique sidewall 38 of the smaller portion. The first and second openings 32 and 34 are for air flowing into the airflow guiding duct 30. A third opening 36 facing the heat dissipating holes 131 in the sidewall 13 of the chassis 10 is defined by the top wall 31 and the sidewalls 33 and 37 of the expanded portion, for air flowing out of the airflow guiding duct 30. A dividing wall 310 perpendicularly protrudes down from a middle of an inner surface of the top wall 31 of the expanded portion, thereby dividing the third opening 36 into two sections. A plurality of guiding tabs 311 protrudes toward the sidewall 13 of the chassis 10 from an outside edge of the top wall 31 of the airflow guiding duct 30, for inserting into the corresponding slots 137 of the chassis 10 thereby guiding the airflow guiding duct 30 to be mounted on the chassis. A height of each receiving slot 137 is greater than the thickness of each guiding tab 311, thereby permitting the guiding tab 311 to move in the receiving slot 137 in a direction perpendicular to the motherboard 15 mounted in the chassis 10. A pair of securing slots 313 is spacedly defined in the top wall 31 corresponding to the securing members 139 of the chassis 10. The size and location of the pair of securing slots 35 are corresponding to that of the pair of securing members 139 respectively, for the securing members 139 engaging in the securing slots 35.

Figure 3:
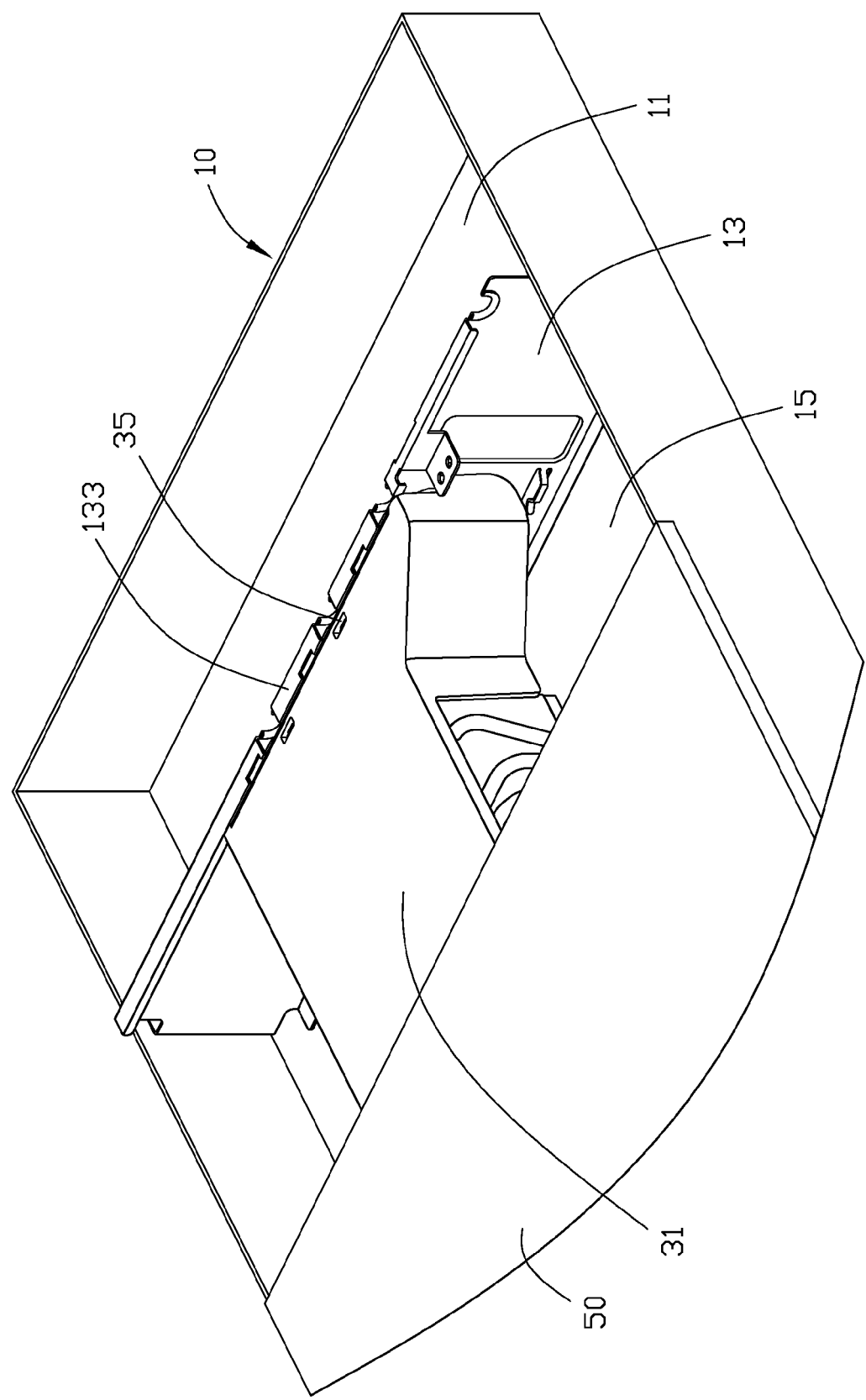
FIG. 3 is an isometric partial view of the computer or server enclosure of FIG. 1 with the airflow guiding duct connected.

Referring to FIG. 3, in assembly, the guiding tabs 311 of the airflow guiding duct 30 are aligned with the slots 137 of the chassis 10. The airflow guiding duct 30 is pushed toward the sidewall 13 of the chassis, with the guiding tabs 311 inserted into the slots 137 underneath the main flange 133, for limiting movement of the airflow guiding duct 30 in the chassis. At this time, the securing slots 313 are aligned with the securing members 139 of the chassis. The airflow guiding duct 30 is pressed down to cover heat dissipating assemblies mounted on the motherboard 15. The securing members 139 tightly engage in the securing slots 313 for limiting movement of the airflow guiding duct 30 in different directions parallel to the motherboard 15. Ultimately, the top cover 50 is mounted on the chassis 10 and abuts against the top wall 31 of the airflow guiding duct 30, thereby the airflow guiding duct 30 is sandwiched between the top cover 50 and the motherboard 15 to limit movement of the airflow guiding duct 30 in a direction perpendicular to the motherboard 15.

In disassembly, the top cover 50 is removed first, and the airflow guiding duct 30 is pulled up away from the motherboard 15. The securing members 139 disengage from the securing slots 313 of the airflow guiding duct 30. Then, the airflow guiding duct 30 is drawn away from the sidewall 13 of the chassis 10, and the guiding tabs 311 of the airflow guiding duct 30 move out of the receiving slot 137 of the chassis 10. Thus, the airflow guiding duct 30 is ready for being removed from the chassis 10.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electronic device, comprising:
a chassis comprising a bottom wall and a sidewall perpendicular to the bottom wall, a circuit board mounted on the bottom wall, a plurality of securing members protruding from a top of the sidewall in a direction perpendicular to the circuit board; and
an airflow guiding duct configured for covering a heat dissipating module mounted on the circuit board, the airflow guiding duct comprising a substantially rectangular base, an expanded portion protruding from a front end of the base, and a smaller portion protruding from a rear end of the base, a first opening defined in the smaller portion configured for allowing air to flow into the airflow guiding duct, a second opening configured for allowing air to flow into the airflow guiding duct defined in a corner of the rectangular base adjacent to the smaller portion, a third opening defined in the expanded portion facing the heat dissipating holes in the sidewall of the chassis and configured for allowing air to flow out of the airflow guiding duct.

2. The electronic device as described in claim 1, wherein the airflow guiding duct comprises a top wall and a plurality of securing slots defined in the top wall, the securing members are lockingly engaged in the securing slots, and thereby limit movement of the airflow guiding duct in directions parallel to the motherboard.

3. The electronic device as described in claim 2, wherein a main flange is perpendicularly bent from a top edge of the sidewall of the chassis, a secondary flange perpendicularly extends down from a side edge of the main flange, and a supporting flange parallel to the main flange extends out from a bottom edge of the secondary flange, the securing members perpendicularly protrude up from the supporting flange.

4. The electronic device as described in claim 3, wherein a plurality of receiving slots is defined in the secondary flange at a joint of the main flange and the supporting flange, and a plurality of guiding tabs protrudes toward the sidewall of the chassis from an outer edge of the top wall of the airflow guiding duct, for inserting in the receiving slots of the sidewall thereby guiding the airflow guiding duct to be mounted in the chassis.

5. The electronic device as described in claim 2, further comprises a cover mounted on the chassis and abutting against the top wall of the airflow guiding duct, for limiting movement of the airflow guiding duct in a direction perpendicular to the circuit board.

6. An electronic device, comprising:
a chassis comprising a bottom wall and a sidewall perpendicular to the bottom wall, a circuit board mounted on the bottom wall, at least one receiving slot defined in the sidewall, and a main flange is perpendicularly bent from a top edge of the sidewall of the chassis, a secondary flange perpendicularly extends down from a side edge of the main flange, and a supporting flange parallel to the main flange extends out from a bottom edge of the secondary flange, a plurality of securing members perpendicularly protrude up from the supporting flange;
an airflow guiding duct configured for covering heat dissipating modules mounted on the circuit board, the airflow guiding duct including a top wall and a plurality of securing slots defined in the top wall corresponding to the securing members, the airflow guiding duct including at least one guiding tab extending in a direction perpendicular to the motherboard; wherein the at least one guiding tab is inserted in the at least one receiving slot of the sidewall in a direction parallel to the circuit board so as to position the airflow guiding duct in the chassis, and the securing members are engaged with the securing slots of the sidewall; and
a cover seating on the chassis and abutting against the top wall of the airflow guiding duct, for securing the airflow guiding duct in the chassis.

7. The electronic device as described in claim 6, wherein the at least one receiving slot is defined in the secondary flange at a joint of the main flange and the supporting flange, and the at least one guiding tab corresponding to the at least one receiving slot protrudes toward the sidewall of the chassis from an outer edge of the top wall of the airflow guiding duct.

8. The electronic device as described in claim 6, wherein the airflow guiding duct comprises a substantially rectangular base, an expanded portion protruding from a front end of the base, and a smaller portion protruding from a rear end of the base, the base and the smaller portion respectively define an opening configured for air flowing into the airflow guiding duct, the expanded portion defines a third opening facing the heat dissipating boles in the sidewall of the chassis configured for air flowing out of the airflow guiding duct.

9. The electronic device as described in claim 8, wherein a dividing wall extends down from a middle of the top wall of the expanded portion, for dividing the third opening into two sections.

* * * * *